(12) United States Patent  
Nakamura et al.

(10) Patent No.: US 7,060,986 B2  
(45) Date of Patent: Jun. 13, 2006

(54) AUTOMATED METHOD OF CORRECTING ABERRATIONS IN ELECTRON BEAM, METHOD OF VISUALIZING ABERRATIONS, AND AUTOMATED ABERRATION CORRECTOR

(75) Inventors: Natsuko Nakamura, Tokyo (JP); Joachim Zach, Heidelberg (DE)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 11/100,350

(22) Filed: Apr. 6, 2005

(65) Prior Publication Data

US 2005/0247884 A1    Nov. 10, 2005

(30) Foreign Application Priority Data

Apr. 7, 2004    (JP) .............................. 2004-113001

(51) Int. Cl.  
*H01J 37/153*    (2006.01)  
*H01J 37/08*    (2006.01)  
*G21K 5/10*    (2006.01)  
*G21K 7/00*    (2006.01)

(52) U.S. Cl. .................. 250/396 R; 250/310; 250/311; 250/396 ML; 250/492.22; 250/492.3

(58) Field of Classification Search ...................... None  
See application file for complete search history.

(56) References Cited

U.S. PATENT DOCUMENTS

| 4,423,305 | A | * | 12/1983 | Pfeiffer | 219/121.28 |
|---|---|---|---|---|---|
| 4,962,313 | A | * | 10/1990 | Rose | 250/311 |
| 5,912,469 | A | * | 6/1999 | Okino | 250/492.23 |
| 6,545,274 | B1 | * | 4/2003 | Morita | 250/307 |
| 6,552,340 | B1 | * | 4/2003 | Krivanek et al. | 250/310 |
| 6,984,823 | B1 | * | 1/2006 | Iwaki et al. | 250/311 |
| 2003/0168617 | A1 | * | 9/2003 | Goto | 250/492.23 |
| 2004/0059444 | A1 | * | 3/2004 | Tsukakoshi | 700/59 |
| 2004/0174588 | A1 | * | 9/2004 | Iwaki et al. | 359/368 |
| 2005/0006598 | A1 | * | 1/2005 | Pearl | 250/492.1 |
| 2005/0012050 | A1 | * | 1/2005 | Shemesh | 250/491.1 |
| 2005/0024612 | A1 | * | 2/2005 | Hirukawa et al. | 355/55 |
| 2005/0072920 | A1 | * | 4/2005 | Inada | 250/311 |
| 2005/0161601 | A1 | * | 7/2005 | Kochi et al. | 250/311 |
| 2005/0206850 | A1 | * | 9/2005 | Shimizu et al. | 353/55 |
| 2005/0236570 | A1 | * | 10/2005 | Morokuma et al. | 250/311 |
| 2005/0247884 | A1 | * | 11/2005 | Nakamura et al. | 250/396 R |
| 2005/0263702 | A1 | * | 12/2005 | Agemura et al. | 250/310 |

FOREIGN PATENT DOCUMENTS

| JP | 08-124838 | 5/1996 |
|---|---|---|
| JP | 2003-521801 | 7/2003 |
| WO | WO 01/56057 A1 | 8/2001 |

* cited by examiner

*Primary Examiner*—John R. Lee  
*Assistant Examiner*—Bernard E. Souw  
(74) *Attorney, Agent, or Firm*—The Webb Law Firm (57) ABSTRACT

There is disclosed a method and apparatus for automatically correcting aberrations in an electron beam by the use of a computer. An axis deviation-correcting means for correcting deviation of the axis of the beam, a focusing means for correcting defocus of the beam, a chromatic aberration-correcting means for correcting chromatic aberration in the beam, and an aperture aberration-correcting means for correcting aperture aberration in the beam are stored in the computer.

7 Claims, 5 Drawing Sheets

AUTOMATED METHOD OF CORRECTING ABERRATIONS IN ELECTRON BEAM, METHOD OF VISUALIZING ABERRATIONS, AND AUTOMATED ABERRATION CORRECTOR

BACKGROUND OF THE INVENTION

1. Field of the Invention

The present invention relates to a method of automatically correcting aberrations in an electron beam, a method of visualizing the aberrations, and an automated aberration corrector.

2. Description of Related Art

In SEM (scanning electron microscopy) imaging, there is the problem that various aberrations in the electron beam deteriorate the resolution. In an attempt to solve this problem, CEOS GmbH (Germany) has developed an aberration corrector for correcting aberrations in an electron beam by the use of electric and magnetic fields that are not rotationally symmetric.

One known instrument of this kind detects an image by an underfocused or overfocused beam, for example. The image is Fourier-transformed. Given computational processing is performed. Then, an inverse-Fourier transform is performed to detect the brightness contour of the probe (see Japan Unexamined Patent Publication No. 2003-521801, for example). Another known technique finds the autocorrelation function of the distribution of differential optical intensities by finding the distribution of optical intensities of an object to be observed placed on the optical axis of a lens and differentiating the distribution to find the distribution of the differentiated optical intensities (see Japan Patent Laid-Open No. H8-124838, for example).

Figure 8:
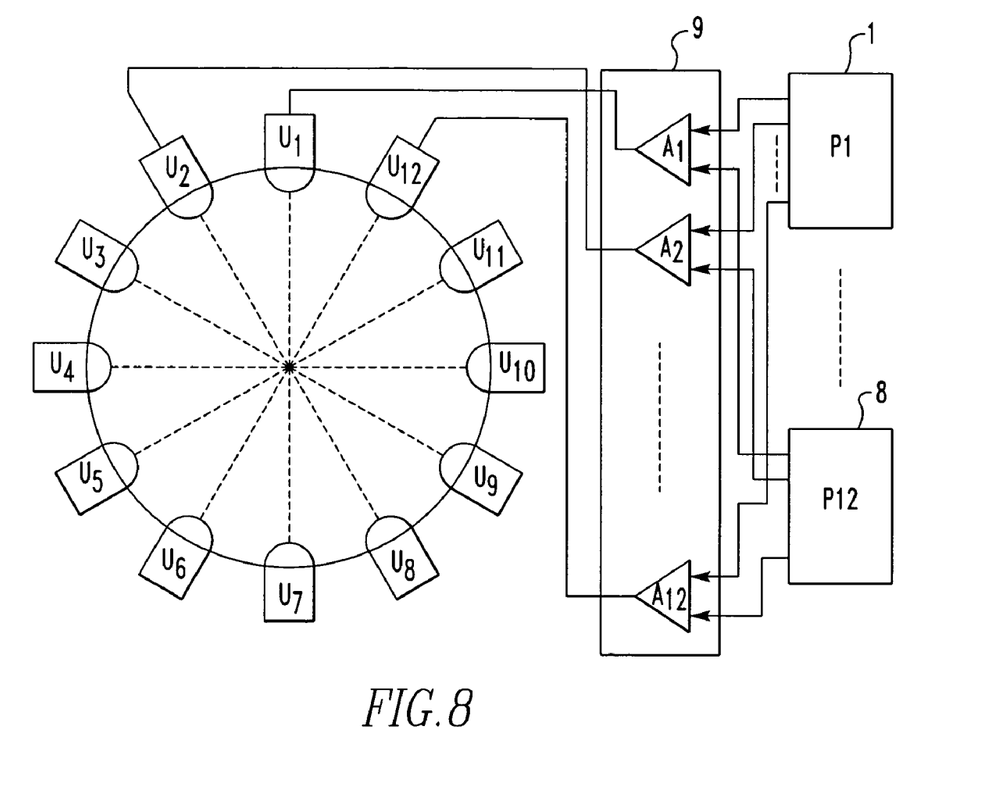
FIG. 8 is a diagram illustrating a method using an electrostatic dodecapole unit as an electrostatic multipolar unit having less than twelve polar elements.

In any of the above-described known instruments, however, it is necessary to complexly control voltages applied to plural polar elements to correct aberrations in the electron beam, the polar elements being equipped in the instrument. FIG. 8 is a diagram illustrating a method of operating an electrostatic multipolar unit 100 having 12 polar elements as an electrostatic multipolar unit having less than 12 polar elements. As shown in the figure, the electrostatic dodecapole unit 100 has polar elements U1 to U12 which are activated via driver amplifiers A1 to A12, respectively, incorporated inside a driver portion 9. The amplifiers A1 to A12 are connected with power supplies P1 to P12, respectively. In the case of a magnetic dodecapole unit, a similar configuration is adopted.

The electrostatic dodecapole unit 100 constructed in this way can produce, by its twelve polar elements, static electric field, dipolar electric field, quadrupole electric field, hexapole electric field, and octopole electric field. Aberrations in the electron beam are corrected by combining these fields. Accordingly, there is the problem that in order to correct aberrations in an electron beam, the operator needs to have skilled technique and fully understand the effects of these fields on the electron beam. An aberration corrector is made up of plural stages. This electrostatic 12-pole unit 100 forms one of the stages.

In order to correct the aberrations in an electron beam using equipment having such multiple polar elements as described above, it is necessary to complexly control the voltages applied to the polar elements. Attempts have been made to automate this operation. However, noise in the image may make it difficult to provide automated control. Manual scanning may result in faster operation if the operator has some degree of skillfulness. However, where the operator manually controls the aberration corrector, it is necessary to estimate the state of aberrations in the electron beam while watching the image. To perform this estimation, the operator needs extensive experience and skillfulness.

In the above-cited Japan Unexamined Patent Publication No. 2003-521801, only a method of measuring the aberrations in an electron microscope is described. Any structure for automatically correcting electron beam aberrations by providing feedback from a computer is not described. Furthermore, any procedure for previously performing correction of deviation of the axis of the electron beam and focusing is not described, though measurements of various aberrations in electron beams are set forth.

SUMMARY OF THE INVENTION

The present invention has been made in view of the foregoing problems. It is an object of the present invention to provide a method and apparatus for automatically correcting aberrations in an electron beam by a computer which also acts to provide a wide range of controls including measurement of aberrations in the beam and control of the aberration corrector, as well as correction of deviation of the axis and focusing necessary for aberration correction of the beam. This assures that even an ordinary user having no knowledge of the aberration corrector corrects aberrations in the beam. It is another object of the present invention to provide a method of visualizing aberrations in an electron beam such that the operator can easily estimate the state of aberrations in the beam. For this purpose, cross sections of the beam and autocorrelation images are visualized and presented to the operator.

A first aspect of the present invention provides a method of correcting aberrations in an electron beam. This method comprises the steps of (1) obtaining a first image when the electron beam is in its initial state, obtaining a second image when a cross section of the beam faces in a certain direction and assumes a linear form, obtaining a third image which faces perpendicularly to the second image and assumes a linear form, deconvoluting the second and third images using the first image to thereby measure the distance of the axis of the beam from the center of each image, and providing feedback to static electric fields of an objective lens and an aberration corrector so as to reduce the distance down to zero (correction of deviation of the axis), (2) varying a value of a quadrupole electric field when the beam is in its initial state to create an underfocused state compared with the original state, obtaining a first image in the underfocused state, creating an overfocused state compared with the original state, obtaining a second image in the overfocused state, autocorrelating each of the images with itself to obtain autocorrelation images, measuring the degree of defocus of the beam from the widths of the peaks in the autocorrelation images, and providing feedback to the quadrupole electric field of the aberration corrector or to both static electric field and quadrupole magnetic field (focusing), (3) slightly increasing and decreasing the accelerating voltage of the electron beam in the initial state of the beam, obtaining two images, autocorrelating each defocus of the electron beam caused by the increase or decrease in the accelerating voltage with itself to thereby calculate autocorrelations, and providing feedback to the static electric field and quadrupole magnetic field of the aberration corrector based on the results of the calculations (correction of chromatic aberration), and (4) obtaining a first image in the initial state of the electron beam, varying the value of the quadrupole electric field of the aberration corrector to create an underfocused state compared with the original state, obtaining a second image in the underfocused state, varying the value of the quadrupole electric field to create an overfocused state compared with the original state, obtaining a third image in the overfocused state, deconvoluting the second and third images using the first image, and providing feedback to the quadrupole electric field, hexapole electric field, and octopole electric field of the aberration corrector based on the results of the deconvolution so as to reduce the aperture aberration in the beam (correction of aperture aberration).

A second aspect of the present invention provides a method of visualizing aberrations in an electron beam. The method comprises the steps of: accepting a first image when the electron beam is in its initial state; varying an electric or magnetic field of an objective lens or aberration corrector in a positive direction and accepting a second image; varying the electric or magnetic field in a negative direction and accepting a third image; and deconvoluting the second and third images using the first image and displaying the results on a display device.

A third aspect of the present invention provides an apparatus for automatically correcting aberrations in an electron beam. The apparatus has an interface for entering an image signal responsive to the electron beam within an electron beam instrument, an interface for controlling the electron beam instrument, an interface for controlling an aberration corrector which, in turn, corrects aberrations in the electron beam, and a computer connected with the interfaces and acting to perform control operations via the interfaces. The computer incorporates an axis deviation-correcting means for correcting deviation of the axis of the beam, a focusing means for correcting defocus of the beam, a chromatic aberration-correcting means for correcting chromatic aberration in the beam, and an aperture aberration-correcting means for correcting aperture aberration in the beam.

A fourth aspect of the present invention provides an apparatus based on the apparatus according to the third aspect and further characterized in that the axis deviation-correcting means obtains a first image when the electron beam is in its initial state, obtains a second image when a cross section of the beam faces in a certain direction and assumes a linear form, obtains a third image which faces perpendicularly to the second image and assumes a linear form, deconvolutes the second and third images using the first image to thereby measure the distance (deviation) of the axis of the beam from the center of each image, and provides feedback to static electric fields of an objective lens and an aberration corrector so as to eliminate the deviation.

A fifth aspect of the present invention provides an apparatus based on the apparatus according to the third aspect and further characterized in that the focusing means varies the value of the quadrupole electric field when the electron beam is in its initial state to create an underfocused state compared with the original state, obtains a first image in the underfocused state, creates an overfocused state compared with the original state, obtains a second image in the overfocused state, autocorrelates each of the two images with itself to obtain autocorrelation images, measures the degrees of defocuses of the beam from the widths of the peaks in the autocorrelation images, and provides feedback to the quadrupole electric field of the aberration corrector or to a static electric field and a quadrupole magnetic field (focusing).

A sixth aspect of the present invention provides an apparatus based on the apparatus according to the third aspect and further characterized in that the chromatic aberration-correcting means slightly increases and decreases the accelerating voltage of the electron beam in the initial state of the beam to obtain two images, autocorrelates each defocus of the electron beam caused by the increase or decrease in the accelerating voltage with itself to thereby calculate autocorrelations, and provides feedback to the static electric field and quadrupole magnetic field of the aberration corrector based on the results (correction of chromatic aberration).

A seventh aspect of the present invention provides an apparatus based on the apparatus according to the third aspect and further characterized in that the aperture aberration-correcting means obtains a first image when the electron beam is in its initial state, varies the value of the quadrupole electric field of the aberration corrector to create an underfocused state compared with the original state, obtains a second image under the underfocused state, varies the value of the quadrupole electric field to create an overfocused state compared with the original state, obtains a third image under the overfocused state, deconvolutes the second and third images using the first image, and provides feedback to the quadrupole electric field, hexapole electric field, and octopole electric field of the aberration corrector based on the results of the deconvolution so as to reduce the aperture aberration in the beam (correction of aperture aberration).

According to the first aspect of the present invention, the step for correcting the deviation of the axis of the electron beam, the step for focusing the beam, the step for correcting the chromatic aberration in the beam, and the step for correcting the aperture aberration in the beam are automatically carried out in turn by the computer. Consequently, even an ordinary user having no knowledge of the aberration corrector can easily correct aberrations in the beam.

According to the second aspect of the present invention, an ordinary image is obtained. Also, two images are obtained after a parameter has been shifted in opposite directions. These two images are deconvoluted. Thus, the operator can see cross sections of the beam and autocorrelation images. By viewing the visualized images, the operator can precisely grasp how the aberrations in the beam have been corrected.

According to the third aspect of the present invention, the axis deviation-correcting means, focusing means, chromatic aberration-correcting means, and aperture aberration-correcting means are built in the computer. In consequence, the various aberrations in the beam can be automatically corrected. It is assured that even an ordinary user having no knowledge of the aberration corrector can correct aberrations in the beam.

According to the fourth aspect of the present invention, the axis deviation-correcting means deconvolutes the second and third images. The second image is obtained when a cross section of the electron beam assumes a linear form facing in a certain direction. The third image is obtained when the cross section of the beam assumes a linear form facing at right angles to the second image. Based on the results of the deconvolution, feedback is provided to the aberration corrector, thus correcting the deviation of the axis of the beam.

According to the fifth aspect of the present invention, the focusing means obtains the first image when the electron beam is in the underfocused state compared with the original state, obtains the second image when the beam is in the overfocused state compared with the original state, and autocorrelates each of the images with itself, calculating autocorrelations. The focusing means provides feedback to the aberration corrector based on the results, thus focusing the beam.

According to the sixth aspect of the present invention, the chromatic aberration-correcting means slightly increases and decreases the accelerating voltage of the electron beam in the initial state of the beam and two images are obtained. Each of the obtained images is autocorrelated with itself, calculating autocorrelations. The correcting means provides feedback to the aberration corrector based on the results. In this way, chromatic aberration in the beam can be corrected.

According to the seventh aspect of the present invention, the aperture aberration-correcting means obtains the first image when the electron beam is in its initial state, obtains the second image when the beam is in the underfocused state compared with the original state, and obtains the third image when the beam is in the overfocused state compared with the original state. The second and third images are deconvoluted using the first image. Based on the results, the correcting means provides feedback to the aberration corrector. Consequently, aperture aberration in the beam can be corrected.

Other objects and features of the present invention will appear in the course of the description thereof, which follows.

DESCRIPTION OF THE PREFERRED EMBODIMENTS

The preferred embodiments of the present invention are hereinafter described in detail with reference to the accompanying drawings.

Figure 1:
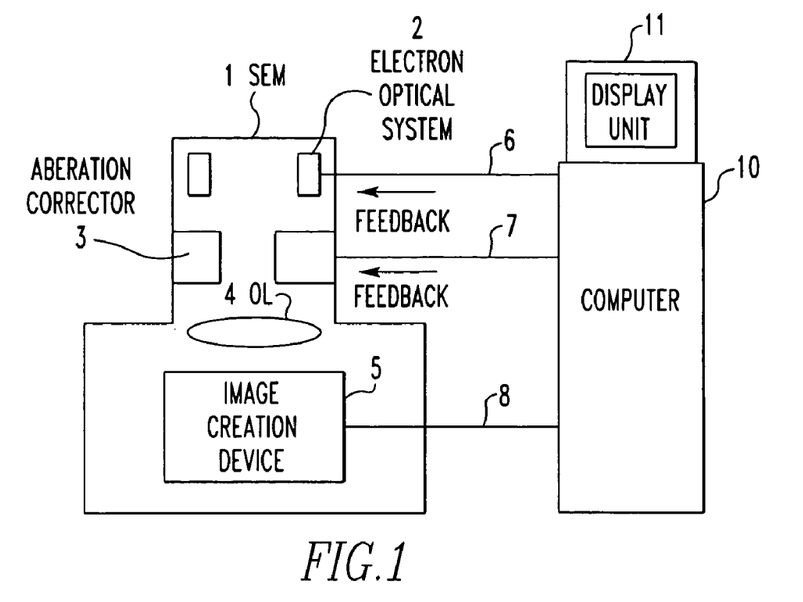
FIG. 1 is a block diagram showing one embodiment of the present invention.

FIG. 1 is a block diagram showing one embodiment of the present invention. Indicated by reference numeral 1 is a scanning electron microscope (SEM) that is an electron beam instrument. The SEM 1 has an electron optical system 2 for focusing and deflecting an electron beam, an aberration corrector 3 for correcting various aberrations regarding the SEM, and an objective lens (OL) 4 for focusing the beam onto a specimen (not shown). An image creation device 5 accepts signals radiated from the surface of the specimen in response to the electron beam impinging on the specimen, and creates images from the accepted signals.

A computer 10 controls processing for correcting the aberrations in the SEM 1. A display unit 11 is ancillary to the computer 10. A CRT, a liquid crystal display or the like is used as the display unit 11. The electron optical system 2 and computer 10 are connected by a signal cable 6. The computer 10 controls the electron optical system via the cable 6. The aberration corrector 3 and computer 10 are connected by another signal cable 7. The computer 10 controls the aberration corrector 3 via the cable 7. The image creation device 5 and computer 10 are connected by an image accepting cable 8.

In the system constructed in this way, the computer 10 incorporates therein an axis deviation-correcting means, a defocus-correcting means (focusing means), a chromatic aberration-correcting means, and an aperture aberration-correcting means. These four means may be realized in hardware but can be more easily realized in software. In the following description, each correcting means is realized in software (computer program).

In the present invention, software according to the present invention operates within the computer 10. The software controls the SEM 1 via the signal cable 6 with the SEM 1. In the SEM 1, an image signal produced in response to the electron beam hitting the specimen is detected and converted into an image by the image creation device 5. The created image is accepted into the computer 10 via the image accepting cable 8. Software for correcting deviation of the axis, software for achieving focusing, software for correcting chromatic aberration, and software for correcting aperture aberration operate in the computer 10. The obtained image signal is image-processed to measure aberrations in the electron beam, deviation of the axis of the beam, defocus, and astigmatism. The computer controls the aberration corrector 3 via the interface (signal cable) 7, thus correcting the aberrations in the beam.

Figure 2:
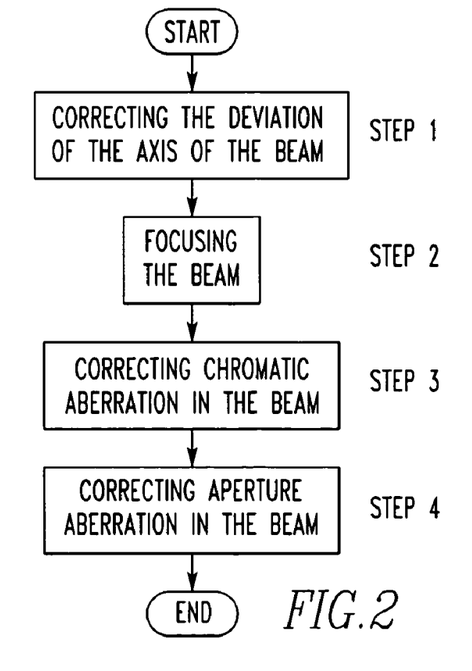
FIG. 2 is a flowchart illustrating a sequence of operations of a method according to the present invention.

FIG. 2 is a flowchart illustrating a sequence of operations performed by a method according to the present invention. To correct the aberrations in the beam within the SEM, it is first necessary to correct deviation of the axis of the beam. Accordingly, in the present invention, the deviation of the axis of the beam is corrected (step 1). Then, the beam is focused (step 2). Then, chromatic aberration in the beam is corrected (step 3). Finally, aperture aberration in the beam is corrected (step 4). The various correcting steps are hereinafter described one by one.

(1) Correction of Deviation of Axis

When the operator instructs the computer 10 to start aberration correction, the computer 10 measures and corrects the deviation of the axis of the beam, first automatically. This operation is carried out as follows. First, an image (denoted by If) is obtained under the initial condition. The aberration corrector 3 produces a dipole electric field by two polar elements to which mutually opposite voltages are applied. Then, the value of the dipole field is operated such that the cross section of the beam takes a linear form facing in a certain direction. Under this condition, an image (denoted by Iu) is obtained. Then, the value of the dipolar field is varied such that the cross section of the beam assumes a linear form facing at right angles to the direction of the image Iu. The resulting image is denoted by Io.

Figure 3A:
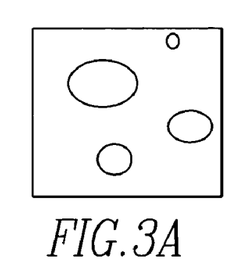
FIGS. 3A, 3B, and 3C show variations of an image produced by an electron beam.
Figure 3B:
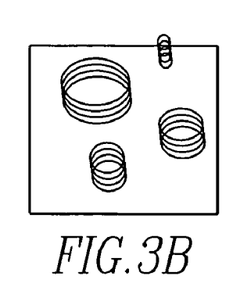
Figure 3C:
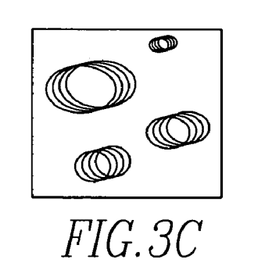

FIGS. 3A–3C show variations of an image produced by the electron beam in this way. It is assumed that an image as shown in FIG. 3A is obtained from a specimen. The image If obtained under the initial condition is similar to the image of FIG. 3A. The image Iu is similar to the image of FIG. 3B. The image Io is similar to the image of FIG. 3C. A specimen having a structure as shown in FIG. 3A was observed using an electron beam having a cross section tilting downward to the right. The obtained image is shown in FIG. 3B. The specimen was observed using an electron beam having a cross section tilting upward to the right. The obtained image is shown in FIG. 3C.

These images If, Iu, and Io are Fourier-transformed, resulting in Ff, Fu, and Fo. A generally used formula about Fourier transformation is now described. Let $\varphi(x)$ be the Fourier transform of $f(t)$. Using $f(t)$, is $\varphi(x)$ is given by $$\varphi(x) = \int_{-\infty}^{\infty} f(t) e^{itx} dt \quad (1)$$

After finding the Ff, Fu, and Fo, Fu/Ff and Fo/Ff are calculated. Then, the Fu/Ff and Fo/Ff are Fourier-transformed to obtain cross sections Pu and Po of the electron beam when the images Iu and Io are obtained. Generally, performing a Fourier transform twice in this way is known as deconvolution.

Figure 4A:
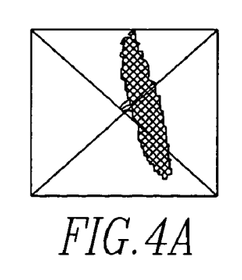
FIGS. 4A and 4B show cross sections of an electron beam.
Figure 4B:
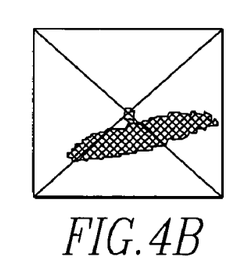

In each image of FIGS. 4A and 4B, the dark portion shows the cross section of the electron beam. FIG. 4A indicates the cross section Pu. FIG. 4B indicates the cross section Po. The software for correcting deviation of the axis measures the distances of the brightest point from the center of each image from the calculated cross sections Pu and Po of the beam. The arrows in FIGS. 4A and 4B indicate the amounts of deviations from the centers. The computer 10 provides feedback to the static electric fields of the objective lens 4 and the aberration corrector 3 in the SEM 1 to eliminate the deviations.

In this way, the software for correcting deviation of the axis deconvolutes the second and third images using the first image obtained under the initial state. The second image is a linear form of the cross section of the electron beam facing in a certain direction. The third image is a linear form of the cross section facing at right angles to the second image. Based on the result, the software provides feedback to the aberration corrector, thus correcting the deviation of the axis of the beam.

(2) Focusing

The computer 10 automatically focuses the electron beam by the focusing software subsequently to the correction of the deviation of the axis of the beam. The operation is carried out as follows.

First, under the initial state of the electron beam, the value of the quadrupole electric field is varied to create an underfocused state compared with the original state. Then, an image is obtained. This image is denoted by Gu. Furthermore, the value of the quadrupole electric field is varied to create an overfocused state compared with the original state. Then, an image is obtained. This image is denoted by Go. In the underfocused state, a crossover point of the beam is created behind the specimen. In the overfocused state, a crossover point of the beam is created ahead of the specimen. Calculation of the autocorrelation images of these images results in a brightness peak appearing in the center of the image. Let $f(t)$ be a function. A function slightly deviating from the function $f(t)$ is given by $f(t+t')$. The autocorrelation function is given by $$\int_{-\infty}^{\infty} f(t) \cdot f(t+t') dt \quad (2)$$

Generally, the width of the peak of the autocorrelation gives an index of how well the electron beam is focused. That is, where the beam is in focus, the width of the peak is narrower. As the beam is defocused more, the width of the peak increases. Where the beam is in focus in the original state, the widths of the peaks in the autocorrelation images of the Gu and Go have the same value. Where the beam is out of focus in the original state, the peaks in the autocorrelation images of Gu and Go are different in width. Therefore, the difference between the widths of the peaks can be regarded as defocus of the beam.

In this way, the focusing software measures the degree of defocus of the electron beam under the original state and provides feedback to the quadrupole electric field of the aberration corrector 3 or the static electric field and quadrupole magnetic field to eliminate the defocus of the beam.

In consequence, the focusing software obtains a first image when the beam is in an underfocused state compared with the original state, obtains a second image when the beam is in an overfocused state compared with the original state, autocorrelates the images, and provides feedback to the aberration corrector based on the results, thus focusing the beam.

(3) Correction of Chromatic Aberration

Subsequently to the focusing of the electron beam, the computer 10 automatically corrects the chromatic aberration in the beam using chromatic aberration-correcting software. The operation is carried out as follows.

This correction is made by taking notice of the fact that when the accelerating voltage of the electron beam is varied, the focal point of the beam shifts. First, under the initial state of the beam, the accelerating voltage of the beam is slightly increased, and an image is obtained. This image is denoted by Hu. Then, under the initial condition, the accelerating voltage is reduced slightly, and an image is acquired. This image is denoted by Ho. Defocus of the beam caused by a change in the accelerating voltage is found by autocorrelation images in the same way as in focusing (2) above.

However, if the electron beam has no chromatic aberration under the original state, the degree of defocus does not differ between Hu and Ho. If the beam has chromatic aberration, the degree of defocus will be different between the two images. Accordingly, the chromatic aberration-correcting software in the computer 10 measures the chromatic aberration in the beam under the original state in this way and provides feedback to the static electric field and quadrupole magnetic field of the aberration corrector 3, thus correcting the chromatic aberration in the beam.

In this way, the chromatic aberration-correcting software slightly increases and decreases the accelerating voltage of the electron beam under the initial state, obtains two images, autocorrelates the obtained images, and provides feedback to the aberration corrector based on the results. As a consequence, the chromatic aberration in the beam can be corrected.

(4) Correction of Aperture Aberration

Aperture aberration in an electron beam includes spherical aberration and deviation from the center of the lens. In addition, the aperture aberration includes directional components. Computer software for correcting the aperture aberration automatically corrects the aperture aberration in the beam subsequently to chromatic aberration in the beam. The operation is carried out using the aperture aberration-correcting software as follows.

First, an image is obtained under the initial condition of the electron beam. This image is indicated by Jf and referred to as the first image. Then, the value of the quadrupole electric field of the aberration corrector 3 is varied to create an underfocused condition compared with the original state. Under this condition, an image is derived. This image is indicated by Ju and referred to as the second image. The value of the quadrupole electric field is varied to create an overfocused condition compared with the original condition. In this state, an image is obtained. This image is denoted by Jo and referred to as the third image. The second image Ju and third image Jo are deconvoluted using the first image Jf.

A cross section Ku of the electron beam under the underfocused condition and a cross section Ko of the beam under the overfocused condition are calculated from the three images, in the same way as already described regarding correction of deviation of the axis. If the images on the cross sections Ku and Ko extend in the same direction, it is caused by on-axis coma in the electron beam. Therefore, the degree of the on-axis coma in the beam can be measured by comparing the elongations of the images in the same direction. If the two images are stretched in directions different by 90°, it is caused by astigmatism in the beam. The degree of astigmatism can be measured by comparing the elongations of the images in the directions differing by 90°. If the images are stretched in three directions, it is caused by three-fold symmetric, second-order aberration. Therefore, the degree of the three-fold symmetric, second-order aberration can be measured by measuring whether the images are stretched in three directions on at least one of the images Ku and Ko. Where there is no third-order aberration, the centers of gravity of the brightness and their vicinities on both Ku and Ko somewhat darken to similar extents. Consequently, the degree of the third-order aberration can be measured by measuring the profiles of the Ku and Ko near the centers of gravity of brightness and taking the difference in curvature between the profiles.

The aperture aberration-correcting software in the computer 10 measures the aperture aberration in the electron beam in the original state and provides feedback to the quadrupole electric field, hexapole electric field, and octopole electric field of the aberration corrector 3, thus correcting the aperture aberration in the beam.

In this way, the aperture aberration-correcting software obtains the first image under the initial condition of the electron beam, obtains the second image under the underfocused condition compared with the original condition, obtains the third image under the overfocused condition compared with the original condition, deconvolutes the second and third images using the first image, and provides feedback to the aberration corrector based on the results, thus correcting the aperture aberration.

By performing the various aberration corrections to the electron beam in succession as described so far, an ordinary user having no knowledge of the aberration corrector can perform automated aberration corrections to the beam simply by adjusting the focus of the beam in the SEM in a normal manner. Consequently, accurate specimen images can be obtained because the aberrations in the beam have been corrected.

A second aspect of the present invention is next described. In the second aspect, images of the electron beam obtained in various process steps performed by the aberration corrector are displayed on a display device, thus visualizing the images and presenting them to the operator. That is, cross sections of the electron beam and autocorrelation images obtained inside are visualized.

Figure 5:
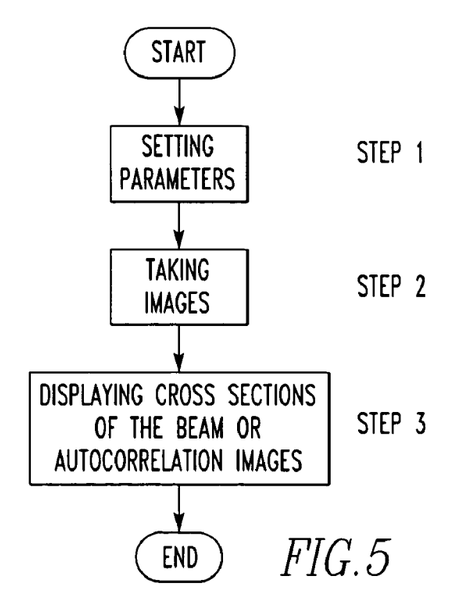
FIG. 5 is a flowchart illustrating a sequence of operations of another method according to the present invention.

FIG. 5 is a flowchart illustrating another sequence of operations of the method according to the present invention. Referring to FIG. 5, parameters are first set (step 1). Then, images are taken (step 2). Finally, cross sections of the beam or autocorrelation images are displayed on the display device (step 3). These process steps are described in detail below. The system configuration is the same as the configuration shown in FIG. 1.

(1) Setting of Parameters

When an operator gives an instruction to visualize the aberrations in the electron beam, the computer 10 prompts the operator to enter parameters regarding the controlled lens or the electric fields of the aberration corrector 3. The operator specifies what is controlled and the amount of control. For example, if the operator wants to visualize the chromatic aberration in the beam, he or she gives an instruction to increase and decrease the accelerating voltage of the beam by tens of volts. If the operator wants to visualize the second- and third-order aperture aberrations in the beam, he or she gives an instruction to increase and decrease the value of the quadrupole electric field of the aberration corrector 3.

(2) Taking of Images

The computer 10 takes one image when the electron beam is in its initial state. This image is denoted by If. The electric field of the aberration corrector 3 or controlled lens which is specified by the operator is increased by the amount specified by the operator, and the image is taken. This image is denoted by Iu. Under the initial state of the beam, the electric field of the aberration corrector 3 or controlled lens which is specified by the operator is reduced by an amount specified by the operator, and an image is taken. This image is denoted by Io.

In the case of visualization of chromatic aberration in the electron beam, autocorrelation images can be used instead of cross sections of the beam. Therefore, the image If is unnecessary. When the operator gives an instruction to increase and decrease the accelerating voltage of the beam by 20 V in order to visualize chromatic aberration in the beam, nothing is accepted under the initial condition of the beam. The image Iu is taken at an accelerating voltage that is higher than the accelerating voltage used in the initial condition by 20 V. The image Io is taken at an accelerating voltage that is lower than the accelerating voltage used in the initial condition by 20 V.

(3) Visualization of Cross Sections of Electron Beam

The aforementioned images If, Iu, and Io provide information about combinations of the specimen structure to be imaged and cross-sectional shape of the beam. First, the operator Fourier-transforms the images If, Iu, and Io, resulting in Ff, Fu, and Fo. Furthermore, Fu/Ff and Fo/Ff are found by division operations. Then, Fourier-transforms of the quotients Fu/Fu and Fo/Ff are calculated once more. That is, deconvolution is performed. These can be regarded as cross sections of the beam at Iu and Io.

Figure 6:
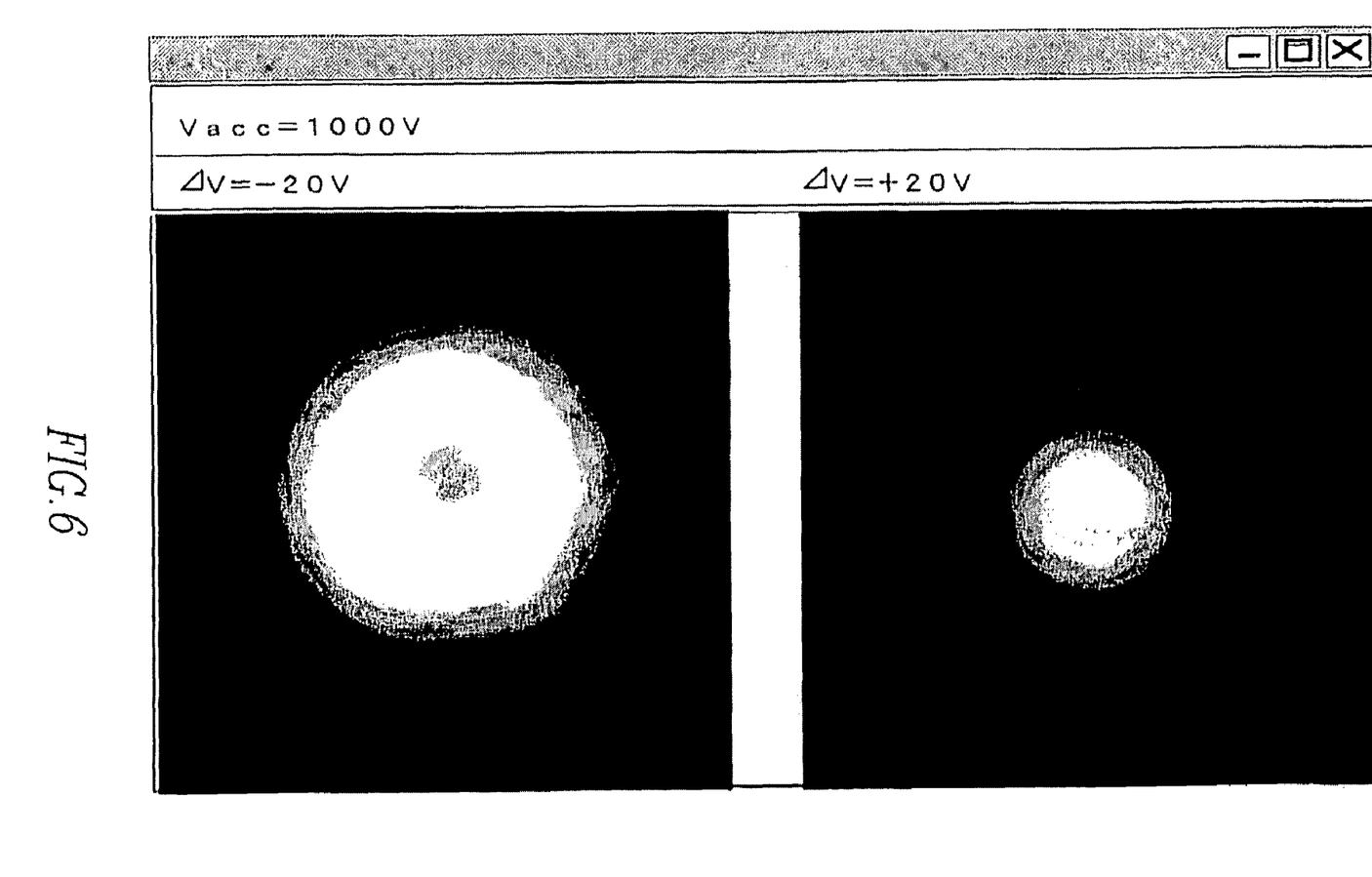
FIG. 6 shows a digital image of an electron beam cross section and an autocorrelation image displayed on a display device.

In the case of chromatic aberration of the electron beam, the image If does not exist. Autocorrelation images calculated from Iu and Io are treated similarly to cross sections of the beam. The computer 10 computes a cross-sectional image of the beam and an autocorrelation image and presents these two images to the operator such that the images are juxtaposed, as shown in FIG. 6, which shows an example of a method of displaying the cross sectional image of the beam and autocorrelation image on the viewing screen of the display device. In this example, the accelerating voltage Vacc is 1,000 V, and the accelerating voltage is increased and decreased in increments of ±20 V. Since a shape shown on the cross-sectional image of the beam or on the autocorrelation image is the shape of an aberration itself, the operator can easily know the state of aberrations in the beam by viewing the cross-sectional images.

Furthermore, the computer 10 computationally finds the states of the two obtained images (i.e., cross-sectional view and autocorrelation image) in which the aberrations in the electron beam have been eliminated. The computer can also display target cross-sectional shape and autocorrelation image. For example, where the accelerating voltage of the beam is increased and decreased in order to visualize the chromatic aberration in the beam and two autocorrelation images are obtained, chromatic aberration is generally present in the beam and the two autocorrelation images are stretched differently. Where the target electron beam has no chromatic aberration, the two autocorrelation images are stretched in the same way. Therefore, they are shown as in FIG. 7.

Figure 7:
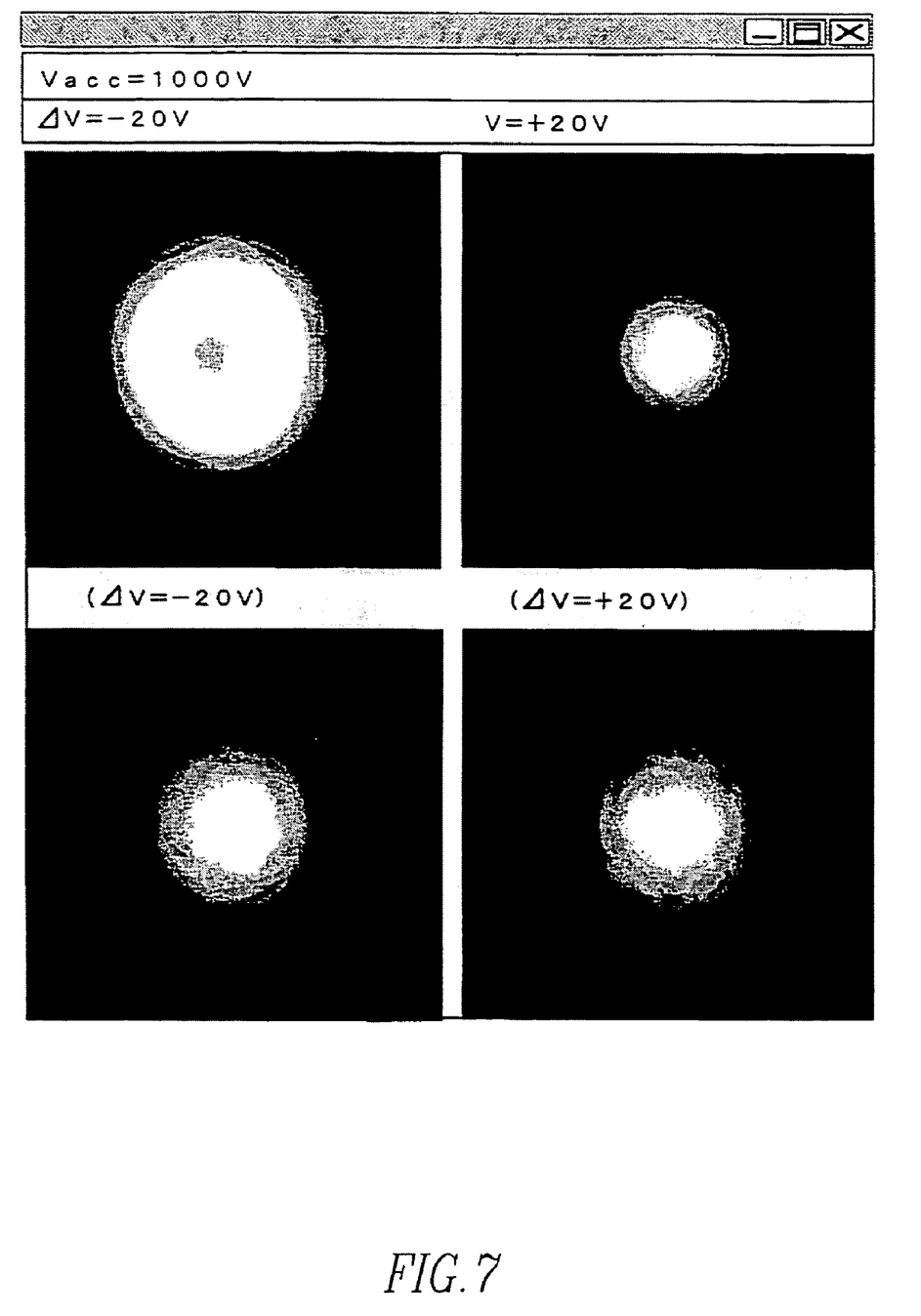
FIG. 7 shows an electron beam cross section and an autocorrelation image displayed on a display device together with their respective target images.

FIG. 7 shows an example in which an electron beam cross section and an autocorrelation image are displayed together with their respective target images. The used accelerating voltage Vacc was 1,000 V. The left half of FIG. 7 shows a target image (lower portion) and an image obtained by a measurement (upper portion) in a case where the voltage increment was −20 V. The right half shows a target image (lower portion) and an image obtained by a measurement (upper portion) in a case where the voltage increment was +20 V.

In this way, according to the present invention, a normal image is obtained. Also, images are obtained after shifting a parameter specified by the operator in different directions and are deconvoluted. This permits the operator to view a cross section of the electron beam and an autocorrelation image. The operator can precisely grasp how the aberration corrections in the beam have been corrected, by viewing the visualized images.

The present invention is used in fields where specimens are observed at high resolution using SEM.

Having thus described our invention with the detail and particularity required by the Patent Laws, what is desired protected by Letters Patent is set forth in the following claims.

The invention claimed is:

1. An automated method of correcting aberrations in an electron beam, comprising the steps of:
   obtaining a first image when the electron beam is in its initial state;
   obtaining a second image when a cross section of the beam faces in a certain direction and assumes a linear form;
   obtaining a third linear image facing at right angles to the second image;
   deconvoluting the second and third images using the first image to thereby measure distance (deviation) of the axis of the electron beam from the center of each image;
   providing feedback to static electric fields of an objective lens and a multipole aberration corrector so as to eliminate the deviation, thus correcting the deviation of the axis;
   varying a value of a quadrupole electric field in the initial condition of the beam to create an underfocused state compared with an original state;
   obtaining a first image in the underfocused state;
   creating an overfocused state compared with the original state;
   obtaining a second image in the overfocused state;
   autocorrelating each of the first and second images with itself to obtain autocorrelation images;
   measuring degree of defocus of the electron beam from widths of peaks in the autocorrelation images;
   providing feedback to the quadrupole electric field of the aberration corrector or to the static electric field and quadrupole magnetic field, thus focusing the beam;
   slightly increasing and decreasing the accelerating voltage of the electron beam in the initial state of the beam and obtaining two images;
   autocorrelating each defocus of the electron beam caused by the increase or decrease in the accelerating voltage with itself to thereby calculate autocorrelations;
   providing feedback to the static electric field and quadrupole magnetic field of the aberration corrector based on results of the calculations, thus correcting chromatic aberration;
   obtaining a first image when the electron beam is in its initial state;
   varying the value of the quadrupole electric field of the aberration corrector to create an underfocused state compared with the original state;
   obtaining a second image in the underfocused state;
   varying the value of the quadrupole electric field to create an overfocused state compared with the original state;
   obtaining a third image in the overfocused state;
   deconvoluting the second and third images using the first image; and
   providing feedback to the quadrupole electric field, hexapole electric field, and octopole electric field of the multipole aberration corrector based on results of the deconvolution so as to reduce aperture aberration in the beam, thus correcting the aperture aberration.

2. A method of visualizing aberrations in an electron beam, comprising the steps of:
   accepting a first image when the electron beam is in its initial state;
   varying an electric or magnetic field of an objective lens or aberration corrector in a positive direction and accepting a second image;
   varying the electric or magnetic field in a negative direction and accepting a third image;
   deconvoluting the second and third images using the first image; and
   displaying results of the deconvolution on a display device.

3. An apparatus for automatically correcting aberrations in an electron beam produced inside an electron beam instrument, comprising:
   an interface for entering an image signal responsive to the electron beam;
   an interface for controlling the electron beam instrument;
   an interface for controlling a multipole aberration corrector that corrects aberrations in the electron beam; and
   a computer connected with the interfaces and performing control operations via the interfaces,
   wherein said computer incorporates therein an axis deviation-correcting means for correcting deviation of the axis of the electron beam, a focusing means for correcting defocus of the beam, a chromatic aberration-correcting means for correcting chromatic aberration in the beam, and an aperture aberration-correcting means for correcting aperture aberration in the beam.

4. An apparatus for automatically correcting aberrations in an electron beam as set forth in claim 3, wherein said axis deviation-correcting means obtains a first image when the electron beam is in its initial state, obtains a second image when a cross section of the beam faces in a certain direction and assumes a linear form, obtains a third linear image facing at right angles to the second image, deconvolutes the second and third images using the first image to thereby measure deviation of the axis of the beam from the center of each image, and provides feedback to static electric fields of an objective lens and an aberration corrector so as to eliminate the deviation, thus correcting the deviation of the axis.

5. An apparatus for automatically correcting aberrations in an electron beam as set forth in claim 3, wherein said focusing means varies a value of a quadrupole electric field of the multipole aberration corrector when the electron beam is in its initial state to create an underfocused state compared with an original state, obtains a first image in the underfocused state, creates an overfocused state compared with the original state, obtains a second image in the overfocused state, autocorrelating each of the first and second images with itself to obtain autocorrelation images, measures degrees of defocuses of the electron beam from widths of peaks in the autocorrelation images, and provides feedback to the quadrupole electric field of the multipole aberration corrector or to a static electric field and a quadrupole magnetic field, thus focusing the beam.

6. An apparatus for automatically correcting aberrations in an electron beam as set forth in claim 3, wherein said chromatic aberration-correcting means slightly increases and decreases the accelerating voltage of the electron beam when the beam is in its initial state, obtains two images, autocorrelates each defocus of the electron beam caused by the increase or decrease in the accelerating voltage with itself to thereby calculate autocorrelations, and provides feedback to the static electric field and quadrupole magnetic field of the multipole aberration corrector based on results of the autocorrelations, thus correcting chromatic aberration.

7. An apparatus for automatically correcting aberrations in an electron beam as set forth in claim 3, wherein said aperture aberration-correcting means obtains a first image when the electron beam is in its initial state, varies the value of the quadrupole electric field of the multipole aberration corrector to create an underfocused state compared with the original state, obtains a second image in the underfocused state, varies the value of the quadrupole electric field to create an overfocused state compared with the original state, obtains a third image in the overfocused state, deconvolutes the second and third images using the first image, and provides feedback to the quadrupole electric field, hexapole electric field, and octopole electric field of the aberration corrector based on results of the deconvolution so as to reduce aperture aberration in the beam, thus correcting the aperture aberration.

* * * * *